(12) United States Patent
Henstra et al.

(10) Patent No.: US 7,034,315 B2
(45) Date of Patent: Apr. 25, 2006

(54) PARTICLE SOURCE WITH SELECTABLE BEAM CURRENT AND ENERGY SPREAD

(75) Inventors: Alexander Henstra, Eindhoven (NL); Jaroslav Chmelik, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 11/058,695

(22) Filed: Feb. 15, 2005

(65) Prior Publication Data
US 2005/0178982 A1    Aug. 18, 2005

(30) Foreign Application Priority Data
Feb. 17, 2004    (NL) .................................... 1025500

(51) Int. Cl.
*H01J 37/26* (2006.01)

(52) U.S. Cl. ........... 250/398; 250/396 R; 250/396 ML; 250/311; 250/305
(58) Field of Classification Search ................ 250/398, 250/396 ML, 396 R
See application file for complete search history.

(56) References Cited

U.S. PATENT DOCUMENTS

| | | | | |
|---|---|---|---|---|
| 3,622,781 A | * | 11/1971 | Liebl | ........................... 250/296 |
| 5,221,844 A | * | 6/1993 | van der Mast et al. | ..... 250/398 |
| 2003/0168606 A1 | | 9/2003 | Adamec et al. | |

OTHER PUBLICATIONS

S. Uhlemann and M. Haider, "Experimental Set-Up of a Fully Electrostatic Monochromator for a 200 kV TEM," the proceedings of the 15th International Congress on Electron Microscopy, session 5/S14. held in Durban, South Africa, Sep. 1-6, 2002.
Gerd Benner, Erik Essers, Bernd Huber and Alexander Orchowski, "Design and First Results of SESAM," LEO Elektronenmikroskople GmbH, Carl Zeiss S-M-T AG, D-73447 Oberkochen, Germany.
Erick Plies and Jan Bartle, "Proposal of a Novel Highly Symmetric Wlen Filter Monochromator," Institut fur Angewandte Physik, Auf der Morgenstelle 10, D-72076 Tubingen, Germany.

* cited by examiner

*Primary Examiner*—Nikita Wells
*Assistant Examiner*—Johnnie L. Smith, II
(74) *Attorney, Agent, or Firm*—Michael O. Scheinberg

(57) ABSTRACT

The invention describes a particle source in which energy selection occurs. The energy selection occurs by sending a beam of electrically charged particles 13 eccentrically through a lens 6. As a result of this, energy dispersion will occur in an image 15 formed by the lens 6. By projecting this image 15 onto a diaphragm 7, it is possible to only allow particles in a limited portion of the energy spectrum to pass. Consequently, the passed beam 16 will have a reduced energy spread. By adding a deflection unit 10, this particle beam 16 can be deflected toward the optical axis 2. One can also elect to deflect a beam 12 going through the middle of the lens 6—and having, for example, greater current—toward the optical axis.

16 Claims, 2 Drawing Sheets

PARTICLE SOURCE WITH SELECTABLE BEAM CURRENT AND ENERGY SPREAD

Figure 1:
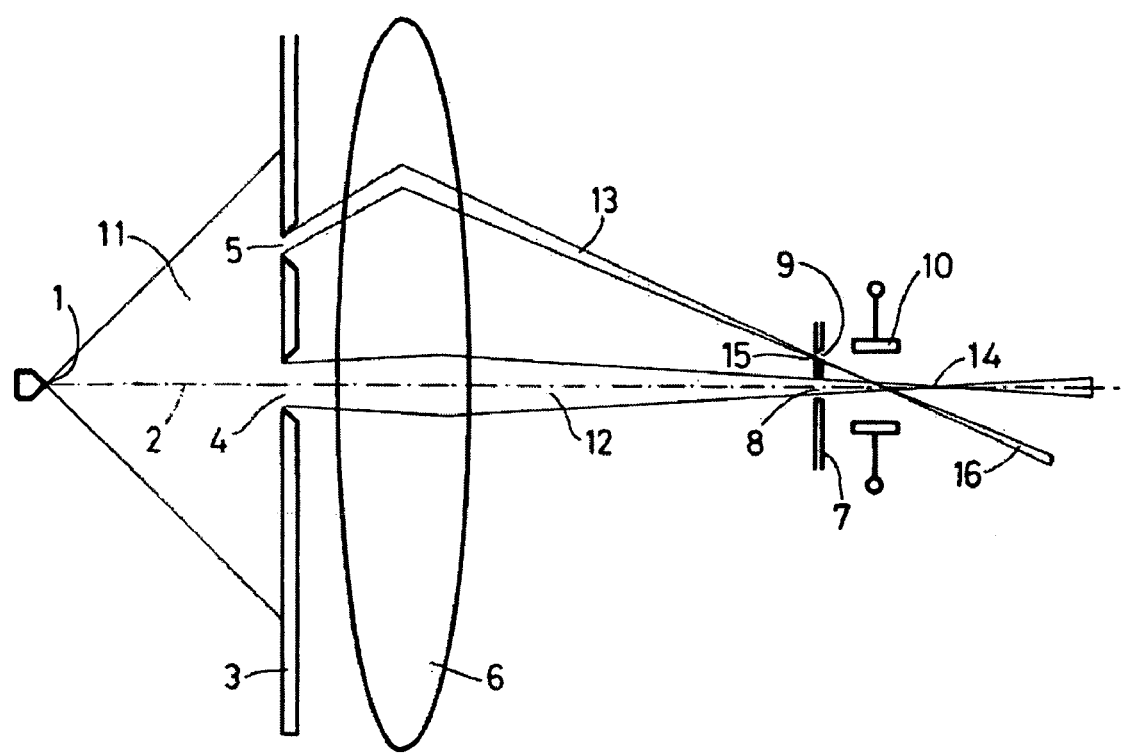

The invention relates to a particle-optical apparatus equipped with a particle source, which particle source is embodied to generate at least one beam of electrically charged particles and which particle source is provided with:
- a particle-emitting surface for emission of the electrically charged particles;
- a lens for formation of an image of the particle-emitting surface;
- a beam-limiting diaphragm for limitation of said beam of particles, and;
- an energy-selecting diaphragm at the location of the image.

Such a particle source for use in a particle-optical apparatus is described in the publication "Experimental set-up of a fully electrostatic monochromator for a 200 kV TEM" by S. Uhlemann and M. Haider, as published in the proceedings of the "15$^{th}$ International Congress on Electron Microscopy", session 5/S14, held in Durban, South Africa, from 1 to 6 Sep. 2002.

The particle beam described therein has the form of an electron source, can be used in, for example, electron microscopes, and serves to provide an electron beam with a small energy spread. In, for example, an electron microscope, a small energy spread of the electron beam is desirable, because the employed electron-optical lenses will then cause a smaller chromatic aberration, as a result of which a higher resolution is obtained.

Chromatic aberration is caused by the fact that, in general, the lens has different optical powers for particles with different energies. A lens (electrostatic or magnetic) will, in general, have a smaller focal length for low-energy particles than for particles with a higher energy. Chromatic aberration is proportional to the energy spread of the particles in the beam. Lower energy spread thus leads to less chromatic aberration.

In the known electron source, an electron beam generated by an electron-emitting surface is focused by a lens with a beam-limiting diaphragm in such a manner that the electron-emitting surface is imaged onto the beam-limiting surface. Between the lens and the image, the electron beam is deflected by a first deflection unit.

As known to the skilled artisan, low-energy particles are deflected to a greater extent by electric or magnetic deflection fields than is the case for high-energy particles. Consequently, as a result of such deflection, spatial energy dispersion will occur. As a result of this energy dispersion, the image formed by the lens is a dispersion line, which is a collection of point foci of particles with different energies, whereby electrons with a given energy will have a corresponding position on the dispersion line.

By mounting a selection slit perpendicular to the dispersion line (and thereby perpendicular to the direction in which energy dispersion occurs), which slit only allows a portion of the dispersion line to pass, the passed electron beam will have a reduced energy spread, since, in the passed portion, only electrons with a certain interval of the original energy spectrum are present.

The beam is subsequently deflected back again by a second deflection unit, such that the passed beam extends along the direction of the beam before it was deflected by the first deflection unit. As a result of the chosen symmetry of the first and second deflection unit, it is also possible to cancel the energy dispersion of the beam caused by the first deflection unit.

The known particle source is a relatively extensive construction. The invention aims to provide a more compact construction.

To this end, the particle source according to the invention is characterized in that the beam-limiting diaphragm is embodied in such a way that said beam is a beam that goes through the lens eccentrically.

The invention is founded upon the insight that it is possible to attain the desired energy dispersion by employing a beam that does not go through the central portion of the lens, but through a portion of the lens that is eccentrically located.

As a result of the fact that the beam goes through the lens eccentrically, low-energy particles in the beam will intersect the optical axis of the lens closer to the lens than particles with a higher energy. The result is that the lens does not image a point-like object as a round image, which would be the case if the beam were to go through the middle of the lens, but instead as a dispersion line. By placing at the location of the dispersion line an energy-selecting diaphragm that only allows a portion of the dispersion line to pass, the energy spread of the passed beam will be reduced with respect to the energy spread originally present in the beam.

The image formed by the lens is a dispersion line, whereby a portion of this dispersion line is allowed to pass by the energy-selecting diaphragm. By giving the energy-selecting diaphragm a size in the dispersion direction that, by approximation, is equal to the width of the dispersion line, the passed beam will emerge from an apparently square image. This apparent image will then serve as an object for any subsequent optical elements. Although a round form is normally used as an object for subsequent optical elements, a square form is a sufficient approximation of the more usual round object form.

The image made with the aid of the eccentric beam is formed outside the optical axis. This is caused by the spherical aberration of the lens, which characterizes itself in that, for a beam that goes through the lens far from the middle of the lens, the lens has a greater optical power than for a beam that goes through the central portion of the lens. Because the image of the particle-emitting surface is formed outside the optical axis of the lens, the energy-selecting diaphragm will therefore also not have to be placed on the axis.

It should be pointed out that the beam-limiting diaphragm can be placed before, in, or behind the lens. That the eccentric beam may not yet be limited as such when traversing the lens is not essential—it is only essential that the particles that eventually form the eccentric beam go through an eccentrically located portion of the lens.

In another embodiment of the particle source according to the invention, the beam-limiting diaphragm is also embodied to allow a beam going through the middle of the lens to pass.

In using a particle source in, for example, an electron microscope, there is often a need for a beam whose properties can be selected, e.g. in one observation situation, a beam with a relatively large current without the need for energy reduction, and, in another observation situation, a beam with reduced energy spread without the need for a large current. It is then advantageous if the particle source can generate each of both types of beam according to need.

This need is satisfied by now also allowing—in addition to the eccentric beam—a central beam, i.e. a beam through the middle of the lens, to pass with a relatively large current.

The relatively large current is achieved by choosing the diaphragm opening of the beam-limiting diaphragm in the case of this central beam to be larger than the diaphragm opening of the beam-limiting diaphragm in the case of the eccentric beam. Because, of course, a larger diameter of the diaphragm opening implies a larger opening angle of the beam and, therefore, a larger current.

It should be pointed out that, for this central beam, no energy reduction is achieved, seeing as no dispersion line with spatial energy dispersion is formed. Consequently, no energy-selecting diaphragm opening is necessary in the case of the central beam. However, the spatial extent of the energy-selecting diaphragm that is present for the eccentric beam should be chosen in such a manner that the central beam is allowed to pass unhindered. This is possible because, as explained earlier, the image derived from the eccentric beam does not lie on the axis, so that the energy-selecting diaphragm for the eccentric beam therefore does not have to extend as far as the optical axis.

Although the image made with the central beam—in the case of excitation of the lens—will lie somewhat further from the lens than the image formed with the aid of the eccentric beam, it is possible to correct for this effect, if desired, by mildly varying the optical power of the lens.

In yet another embodiment, the particle source according to the invention is provided with a deflection unit, which deflection unit is embodied to deflect one of the beams of electrically charged particles toward an optical axis, in such a manner than this beam further propagates about the optical axis.

This embodiment is particularly attractive if there is a need for different beams with different properties in terms of current and energy spread. The beams may comprise a central beam and one or more eccentric beams. This can be achieved by applying both several beam-limiting diaphragms and several energy-selecting diaphragms. The desired differences in current are achieved by choosing the diameters of the diaphragm openings in the beam-limiting diaphragm to be different, whereas the differences in energy spread can be attained by choosing the diameters of the diaphragm openings in the energy-selecting diaphragm to be different.

When using the particle source according to the invention in, for example, an electron microscope, one of the beams is selected. It is desired to manipulate the selected beam in such a manner that this is available about the optical axis for subsequent optical elements that are known per se. This can be achieved by placing a deflection unit in the vicinity of the energy-selecting diaphragm. The selected beam is deflected by the deflection unit toward the optical axis, whereby the other, non-selected beams are not brought into a location about the optical axis. These non-selected beams can be blocked by diaphragms placed behind the deflection unit.

It should be pointed out that the deflection unit and lens may be embodied to be electrostatic or magnetic. A purely electrostatic embodiment is advantageous when the particle source is an ion source, seeing as it is easier to focus and deflect ions with electric fields than with magnetic fields. In addition, electrostatic lenses generally cause greater chromatic aberration than magnetic lenses, which in this case means that the (desired) energy dispersion of an electrostatically embodied lens is greater than that of a magnetically embodied lens.

In yet another embodiment, the particle-emitting surface has the form of several, non-juxtaposed, particle-emitting constituent surfaces.

This embodiment is advantageous because it is possible herewith to form beams that go through the lens at a position so far from the axis that the eccentric diaphragm opening can no longer be illuminated by a particle-emitting surface placed on the axis. This is because, in general, particle-emitting surfaces only emit particles within a limited opening angle.

So as to allow the image to be formed at substantially the same position as where the beam traverses the optical axis, the beams of electrons going through the beam-limiting diaphragm should be essentially parallel beams. This can be achieved by placing an assistive lens in the vicinity of each of the particle-emitting constituent surfaces in such a manner that the particle-emitting constituent surface is located in a focal plane of this assistive lens.

It should be pointed out that it is possible to give the particle-emitting constituent surfaces not only another position, but also another orientation with respect to the optical axis, i.e. such that the beam does not demonstrate symmetry about an axis parallel to the optical axis.

Figure 2:
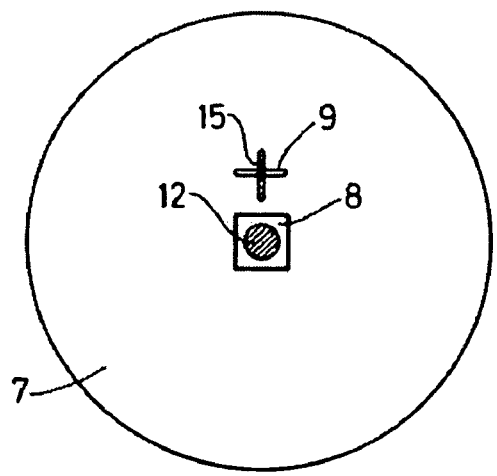
Figure 3:
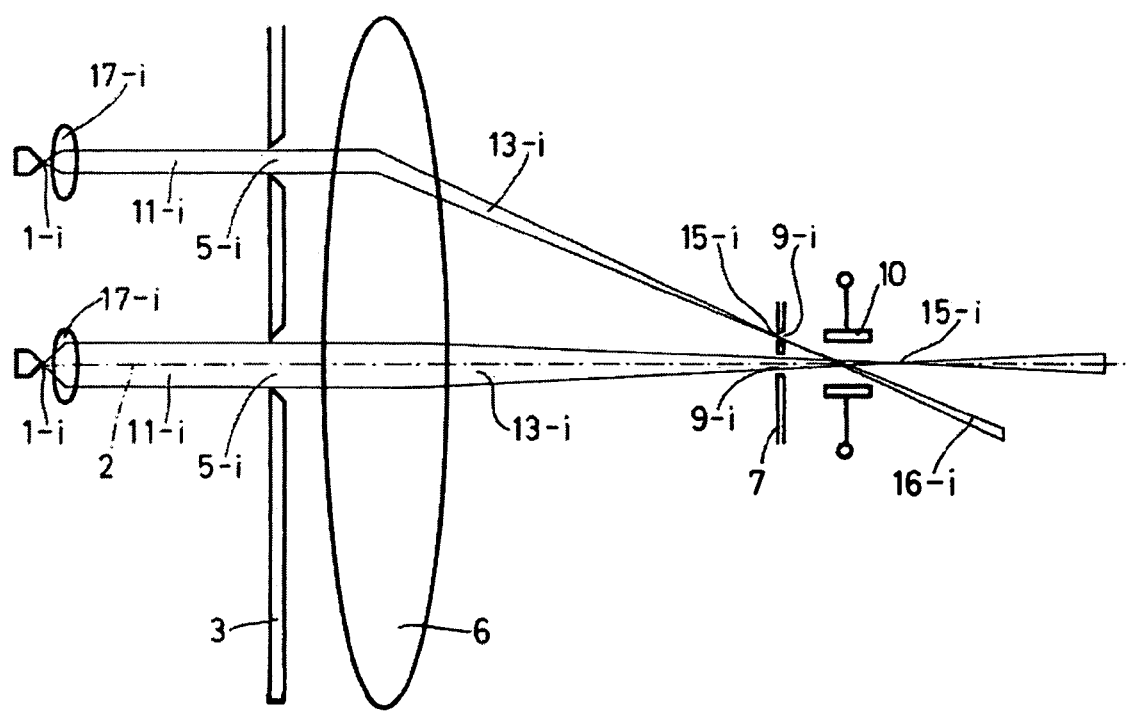

The invention will be further described on the basis of figures, whereby identical reference numerals indicate corresponding elements. In this respect:

FIG. 1 schematically depicts, in cross-section, a particle source according to the invention;

FIG. 2 renders a schematic elevation of a diaphragm in which a diaphragm opening has been cut out for the purpose of allowing the central beam to pass, and in which is located an energy-selecting diaphragm opening for partially allowing the eccentric beam to pass, as employed in a particle source according to the invention;

FIG. 3 shows a particle beam according to the invention, whereby the particle-emitting surface assumes the form of several, non-juxtaposed, particle-emitting constituent surfaces.

FIG. 1 schematically shows, in cross-section, a particle source according to the invention. A particle-emitting surface, such as the electron-emitting surface 1 of a field emission source of electrons, is located on an optical axis 2. The beam of electrons 11 emergent from the electron-emitting surface 1 is sub-divided by a diaphragm 3—containing beam-limiting diaphragm openings in the form of round holes 4 and 5—into a central beam 12 and an eccentric beam 13. Both beams 12 and 13 are focused by a lens 6 placed on the optical axis 2. The electron-emitting surface 1 is imaged by the lens 6, so as to form image 14 via beam 12 and to form image 15 via beam 13. The energy-selecting diaphragm opening 9 is located in a diaphragm 7, in which diaphragm 7 a cut-out 8 is also made so as to allow the central beam 12 to pass. In the vicinity of the position where the beam 13 goes through the axis, a deflection unit 10 is placed, which deflects one of the beams (12, 13) about the optical axis 2.

The electron-emitting surface 1 emits electrons into the beam 11. This beam 11 illuminates both the diaphragm opening 4, which is located centrally about the optical axis 2, and the eccentrically located diaphragm opening 5. The diaphragm openings 4 and 5 are embodied as round cut-outs in diaphragm 3. In the case of a field emission source, this diaphragm 3 can also serve as an extraction electrode, whereby a voltage difference is applied between the diaphragm 3 and the electron-emitting surface 1. The size of the diaphragm openings 4 and 5 determines the current in the beams 12 and 13. The eccentricity of the diaphragm opening 5 determines the energy dispersion of the eccentric beam 13.

The central beam 12 formed by the diaphragm opening 4 is focused by the lens 6, located about the optical axis 2, whereby an image 14 of the electron-emitting surface 1 is formed. Similarly, the eccentric beam 13 is focused, whereby an image 15 (the dispersion line) of the electron-emitting surface is formed.

FIG. 2 shows an elevation of the diaphragm 7, in which diaphragm openings (8, 9) have been cut out so as to allow the central beam 12 and the eccentric beam 13 to pass.

FIG. 2 shows an elevation of diaphragm 7, i.e. what the diaphragm looks like from the side of the source. The central beam 12—located about the optical axis—traverses the diaphragm opening 8 formed by a cut-out in the diaphragm 7. The lens 6 focuses the eccentric beam 13, whereby an image 15 of the electron-emitting surface 1 is formed on the diaphragm 7.

As a result of the chromatic aberration of the lens 6, the image 15 of the electron emitting surface 1 is stretched out in the radial direction into a dispersion line. As a result, electrons with a higher-than-nominal energy will be located further from the optical axis 2 than electrons with a lower-than-nominal energy, because the lens 6 demonstrates a less potent refractive effect for electrons with a high energy than it does for electrons with a low energy.

By now allowing only a portion of this beam 13 to pass, the passed beam 16 will have a smaller energy spread than the beam 13 incident upon the diaphragm 7. This is achieved by endowing the diaphragm opening 9 with a dimension in the radial direction that is smaller than the length of the image 15 in the radial direction.

In, for example, electron microscopes, it is desirable that the various images formed of the electron source have a form that is approximately round. A line-like image of the electron source can cause artifacts. By endowing the diaphragm opening 9 with a dimension in the radial direction that is approximately equal to the width of the image 15 in the tangential direction, the electrons in the passed beam 16 will emerge from an approximately square portion of the image 15, which will usually transpire to be a sufficient approximation of the round form.

Because the width of the image 15 in the tangential direction is equal to the (apparent) size of the electron-emitting surface 1 multiplied by the magnification of the lens 6, it is advantageous if the image 15 of the electron-emitting surface 1 as formed by the lens 6 is an enlarged image.

It is desirable that the diaphragm opening 9 allow the portion of the image 15 with the highest electron density to pass, seeing as this will result in the highest current in the passed beam 16. It is therefore desired that the image 15 be movable over the diaphragm opening 9, for example with the aid of a deflection unit positioned on the source side of diaphragm 7.

Because the beam 13 goes through the lens eccentrically, the point foci that together form the dispersion line at the location of the image 15 will be afflicted with astigmatism. This astigmatism can be cancelled with the aid of a stigmator unit. An attractive embodiment is to combine the deflection unit, which is used to move the beam 13 over the diaphragm opening 9, with a stigmator unit.

In addition to the use of a deflection unit to move the beam 15 over the diaphragm opening 9, other methods can also be used, for example mechanically displacing the electron-emitting surface 1, the lens 6 or the diaphragm 7, or mildly defocusing the lens 6.

The point foci that together form the dispersion line at the location of the image 15 are also afflicted with further errors, such as coma, diffraction, etc. For a given eccentricity of the beam in the lens, it is possible, by means of a suitable choice of the opening angle of the beam 13, to reduce these errors to such an extent that the resulting dispersion line has a much greater extent in the direction of the energy dispersion than in the direction perpendicular thereto. In this manner, it is possible to achieve an effective energy filtering with the aid of the diaphragm opening 9.

The beams 12 and 16 that are allowed to pass by the diaphragm 7 can, for example, be focused on a sample that is to be analyzed, using techniques known per se. It is thereby generally of importance that the beam that is focused on the sample be centered about the optical axis 2. This is achieved by the deflection unit 10, which, by means of suitable excitation, can deflect either the beam 16 or the beam 12 about the optical axis 2.

It should be pointed out that, although only one eccentric beam is depicted, it is possible to form several eccentric beams, by cutting out several eccentric diaphragm openings in diaphragm 3 and several energy-selecting diaphragm openings in diaphragm 7, whereby the deflection unit 10 deflects one of these beams about the optical axis 2.

FIG. 3 shows a particle source according to the invention, whereby the particle-emitting surface assumes the form of several, non-juxtaposed, particle-emitting constituent surfaces.

FIG. 3 shows a number N of particle-emitting constituent surfaces 1-1, ..., 1-N, which are generally indicated by 1-$i$. These particle-emitting constituent surfaces 1-$i$, e.g. in the form of discrete, electron-emitting field emitters, each produces its own beam of electrons 11 -$i$. Each of these beams 11-$i$ is limited by its own beam-limiting diaphragm opening 5-$i$.

This embodiment is advantageous in that it provides the possibility of forming beams 11-$i$ that go through the lens 6 at a location so far from the axis 2 that the eccentric diaphragm openings 5-$i$ can no longer be illuminated by a particle-emitting surface placed on the axis 2. This is because particle-emitting surfaces generally emit particles within a limited opening angle.

So as to form the image 15-$i$ at substantially the same position as the location where the beam 13-$i$ traverses the optical axis, the beams of electrons 11-$i$ incident upon the lens 6 should be essentially parallel beams. This can be achieved by placing an assistive lens 17-$i$ in the vicinity of each of the electron-emitting constituent surfaces 1-$i$, in such a manner that the electron-emitting constituent surface 1-$i$ is located in a focal plane of this assistive lens 17-$i$.

It should be pointed out that it is possible to give the particle-emitting constituent surfaces 11-$i$ not only another position, but also another orientation with respect to the optical axis 2, i.e. such that the beam 11-$i$ does not demonstrate symmetry about an axis parallel to the optical axis 2.

The invention claimed is:

1. A particle-optical apparatus equipped with a particle source, which particle source is embodied to generate at least one beam of electrically charged particles (16) and which particle source is provided with:
   a particle-emitting surface for emission of the electrically charged particles;
   a lens for formation of an image of the particle-emitting surface;
   a beam-limiting diaphragm for limitation of said beam of particles, and;
   an energy-selecting diaphragm at the location of the image, characterized in that
   the beam-limiting diaphragm is embodied in such a way that said beam is a beam that goes through the lens eccentrically.

2. A particle-optical apparatus according to claim 1, in which the beam-limiting diaphragm is also embodied to allow a beam going through the middle of the lens to pass.

3. A particle-optical apparatus according to claim 1, provided with a deflection unit, which deflection unit is embodied to deflect one of the beams of electrically charged particles toward an optical axis, in such a manner than this beam further propagates about the optical axis.

4. A particle-optical apparatus according to claim 1, in which the particle-emitting surface has the form of several, non-juxtaposed, particle-emitting constituent surfaces.

5. A particle source for use in a particle-optical apparatus, the particle source configured to generate at least one beam of electrically charged particles, the particle source comprising:
- a particle-emitting surface for emission of the electrically charged particles;
- a lens for formation of an image of the particle-emitting surface;
- a beam-limiting diaphragm for limitation of said beam of particles, the beam-limiting diaphragm is embodied in such a way that said beam is a beam that goes through the lens eccentrically; and
- an energy-selecting diaphragm at the location of the image.

6. A particle-optical apparatus according to claim 2, provided with a deflection unit, which deflection unit is embodied to deflect one of the beams of electrically charged particles toward an optical axis, in such a manner than this beam further propagates about the optical axis.

7. A particle-optical apparatus according to claim 2, in which the particle-emitting surface has the form of several, non-juxtaposed, particle-emitting constituent surfaces.

8. A particle-optical apparatus according to claim 3, in which the particle-emitting surface has the form of several, non-juxtaposed, particle-emitting constituent surfaces.

9. A particle-optical apparatus according to claim 6, in which the particle-emitting surface has the form of several, non-juxtaposed, particle-emitting constituent surfaces.

10. A particle-optical source according to claim 5, in which the beam-limiting diaphragm is also embodied to allow a beam going through the middle of the lens to pass.

11. A particle-optical source according to claim 5, provided with a deflection unit, which deflection unit is embodied to deflect one of the beams of electrically charged particles toward an optical axis, in such a manner than this beam further propagates about the optical axis.

12. A particle-optical source according to claim 10, provided with a deflection unit, which deflection unit is embodied to deflect one of the beams of electrically charged particles toward an optical axis, in such a manner than this beam further propagates about the optical axis.

13. A particle-optical source according to claim 5, in which the particle-emitting surface has the form of several, non-juxtaposed, particle-emitting constituent surfaces.

14. A particle-optical source according to claim 10, in which the particle-emitting surface has the form of several, non-juxtaposed, particle-emitting constituent surfaces.

15. A particle-optical source according to claim 11, in which the particle-emitting surface has the form of several, non-juxtaposed, particle-emitting constituent surfaces.

16. A particle-optical source according to claim 12, in which the particle-emitting surface has the form of several, non-juxtaposed, particle-emitting constituent surfaces.

* * * * *